United States Patent
Krasser et al.

(10) Patent No.: US 7,642,821 B2
(45) Date of Patent: Jan. 5, 2010

(54) METHOD FOR SYNCHRONIZING A CLOCK SIGNAL WITH A REFERENCE SIGNAL, AND PHASE LOCKED LOOP

(75) Inventors: Guenter Krasser, Graz (AT); Thomas Duda, Duisburg (DE)

(73) Assignee: Infineon Technologies AG, Neubiberg (DE)

( * ) Notice: Subject to any disclaimer, the term of this patent is extended or adjusted under 35 U.S.C. 154(b) by 31 days.

(21) Appl. No.: 11/675,191

(22) Filed: Feb. 15, 2007

(65) Prior Publication Data

US 2007/0194819 A1 Aug. 23, 2007

(30) Foreign Application Priority Data

Feb. 15, 2006 (DE) .................... 10 2006 007 094

(51) Int. Cl.
*H03L 7/06* (2006.01)
(52) U.S. Cl. ................... 327/156; 327/147; 375/376; 370/509; 370/516; 370/520; 331/25
(58) Field of Classification Search .............. 327/147, 327/150, 156, 159; 375/375, 376; 370/503, 370/509, 510, 512, 516, 520; 331/18, 25, 331/1 A
See application file for complete search history.

(56) References Cited

U.S. PATENT DOCUMENTS

| | | | |
|---|---|---|---|
| 4,686,560 A * | 8/1987 | Balaban et al. | 348/508 |
| 4,694,327 A * | 9/1987 | Demmer et al. | 348/508 |
| 5,334,952 A | 8/1994 | Maddy et al. | |
| 5,748,044 A | 5/1998 | Xue | |
| 6,707,329 B2 * | 3/2004 | Shenoi | 327/156 |
| 2003/0185317 A1 * | 10/2003 | Borowski et al. | 375/327 |

FOREIGN PATENT DOCUMENTS

| DE | 102 13 838 A1 | 10/2003 |
|---|---|---|
| JP | 57160225 A | * 10/1982 |

* cited by examiner

*Primary Examiner*—Lincoln Donovan
*Assistant Examiner*—Patrick O'Neill
(74) *Attorney, Agent, or Firm*—Dicke, Billig & Czaja, PLLC

(57) ABSTRACT

A method for synchronizing a clock signal with a reference signal is disclosed. One embodiment has a first synchronization part which has a bit pattern having a particular clock period, a pause whose length is a multiple of this clock period plus a fraction of the clock period, and a second synchronization part having the particular clock period. The method includes generating a phase difference signal which is proportional to a phase difference between the clock signal and the reference signal, filtering the phase difference signal and providing a filtered phase difference signal, driving a digital oscillator in such a manner that the frequency of the clock signal is changed on the basis of the filtered phase difference signal, the phase of the clock signal within a clock period being corrected by a value corresponding to the fraction of the clock period at an end of the pause in the reference signal.

16 Claims, 3 Drawing Sheets

METHOD FOR SYNCHRONIZING A CLOCK SIGNAL WITH A REFERENCE SIGNAL, AND PHASE LOCKED LOOP

CROSS-REFERENCE TO RELATED APPLICATIONS

This Utility Patent Application claims priority to German Patent Application No. DE 10 2006 007 094.1-42 filed on Feb. 15, 2006, which is incorporated herein by reference.

BACKGROUND

The invention relates to a method for synchronizing a clock signal with a reference signal with the aid of a phase locked loop.

In a digital transmission system, a transmitter uses a transmission channel to transmit a data word according to a transmission clock to a receiver. In order to be able to recover the digitally transmitted word from a received signal sequence, the receiver needs the transmission clock signal with which the word was transmitted. Since this clock signal is not concomitantly transmitted in many applications, the receiver must reconstruct the clock signal from the received signal sequence. Therefore a transmitted signal sequence generally includes a synchronization part which is placed in front of the data part. In this case, the receiver can reconstruct the transmission clock signal from the signal sequence, which is typically effected with the aid of a phase locked loop. These signal sequences are often standardized and cannot be arbitrarily configured by the user.

A special signal sequence which is used, for example, in remotely controllable central locking systems in motor vehicles and which includes a code for opening or closing the vehicle in the data part is illustrated in FIG. 1. The signal sequence 50 includes a first synchronization part 53, a pause, a second synchronization part 54 and data words 55 which comprise, for example, a code for opening a vehicle. The synchronization parts 53, 54 include a bit sequence which is also present in the transmission clock. The clock period of this transmission clock is denoted $T_Z$ below. A length $T_P$ of the pause 51 is equal to an integer multiple of the transmission clock period $T_Z$ plus a fraction of the transmission clock period $T_Z$. The time $t_1$ denotes the beginning of the pause 51 and the time $t_2$ denotes the end of the pause 51.

The two synchronization parts 53, 54 form the reference signal x which is interrupted by the pause 51 and can be used by a phase locked loop (not illustrated in FIG. 1), which is arranged at the receiver end, to reconstruct the transmission clock signal. The reconstructed clock signal is available at the output of the phase locked loop and is at the same frequency and has the same phase as the reference signal x.

In a conventional phase locked loop, the reconstructed transmission clock signal at the output of the phase locked loop is adjusted, during the first synchronization part 53 of the reference signal x, until its phase and frequency match the phase and frequency of the transmitted reference signal x. This adjustment results in a transient process during which the frequency of the reconstructed clock signal can vary slightly. During the pause 51 in the reference signal, regulation is interrupted and the clock signal at the output of the phase locked loop oscillates at that frequency and with that phase which it had at the beginning $t_1$ of the pause 51. However, after the end $t_2$ of the pause 51, regulation of the output signal is intended to be continued again. If the length $T_P$ of the pause were an integer multiple of the clock period $T_Z$ of the reference signal, it would be necessary to correct at most one small regulation error in the phase during the second synchronization part. However, since the length of the pause is a noninteger multiple of the clock period $T_Z$, the clock signal and the reference signal x have a relatively large phase difference at the beginning of the second synchronization part, which in turn results in a relatively long transient regulation process during which the frequency of the output signal from the phase locked loop also changes.

This transient process when adjusting the phase difference is inevitably present in the known phase locked loops and is justified by the principle of feedback. However, there is a need for a method for synchronizing a clock signal with a reference signal and for a corresponding phase locked loop, which provides a good stabilization process in the event of a sudden phase change in the reference signal.

SUMMARY

One embodiment of the invention provides a clock signal synchronized with a reference signal. In this case, the reference signal includes a first synchronization part having a bit pattern with a particular clock period, a pause whose length is a multiple of this clock period plus a fraction of this clock period, and a second synchronization part having this particular clock period.

According to one embodiment of the method, a phase difference signal which is proportional to a phase difference between the clock signal and the reference signal is generated. The method also involves filtering the phase difference signal and providing a filtered phase difference signal. In addition, a digital oscillator is driven in such a manner that the frequency of the clock signal is changed on the basis of the filtered phase difference signal. The phase of the clock signal within a clock period is corrected by a value corresponding to the fraction of the clock period at an end of the pause in the reference signal.

This correction is possible because the length of the pause and the resulting phase difference between the reconstructed clock signal and the reference signal are known. This known phase correction value is supplied to an oscillator, which generates the clock signal, during a clock period that follows the end of the pause, which oscillator, as a result, suddenly changes the phase of the clock signal (the output signal from the oscillator) without changing the frequency of the latter in the process.

So that the phase locked loop does not continue to regulate during the pause in the reference signal and the oscillator which generates the clock signal remains in its state (that is to say the frequency and phase of the clock signal remain at that value which they had at the beginning of the pause), the phase difference signal is set to zero at the beginning of the pause, for example.

The digital oscillator may have an accumulator register, at least one state memory and an adder. In this oscillator, the current value of the filtered phase difference signal is added to the value stored in the accumulator register in each clock period, and the known phase correction value is additionally added to the accumulator register, and thus the phase of the clock signal is suddenly corrected, only in that clock cycle in which the end of the pause is also detected.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
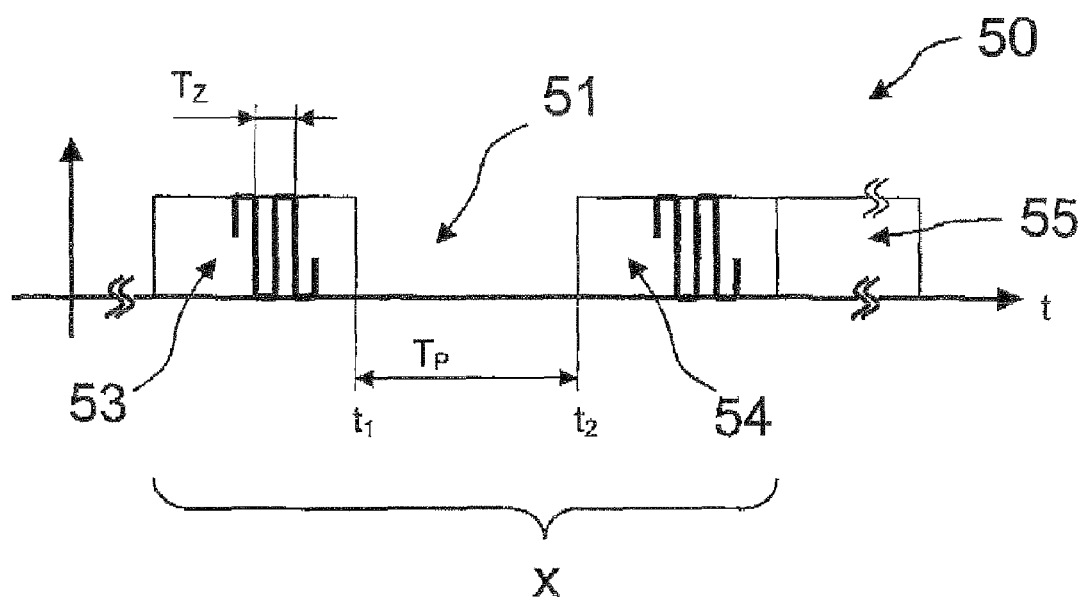
FIG. 1 illustrates a reference signal with a pause.

FIG. 1 illustrates a signal sequence 50 as is used, for example, in remotely controllable central locking systems of motor vehicles. The reference signal x includes, in temporal succession, a first synchronization part 53, a pause 51 of the length $T_P$ between the starting time $t_1$ of the pause and the end time $t_2$, and a second synchronization part 54. The latter is followed by a data part 55 having data words which are to be transmitted and contain, for example, a code for opening or closing a vehicle.

The first synchronization part 53 includes a bit pattern (for example 101010101) having a transmission clock period $T_Z$. The second synchronization part 54 includes a further bit pattern having the same transmission clock period $T_Z$. However, this further bit pattern need not be identical to the bit pattern of the first synchronization part. In this case, the length of the pause $T_P$ is always a noninteger multiple of the clock period $T_Z$. This method is used to synchronize a clock signal with the reference signal x, which has a pause 51, and thus to reconstruct the transmission clock signal which is needed to correctly receive the data words transmitted in the data part 55 of the signal sequence 50.

Figure 2:
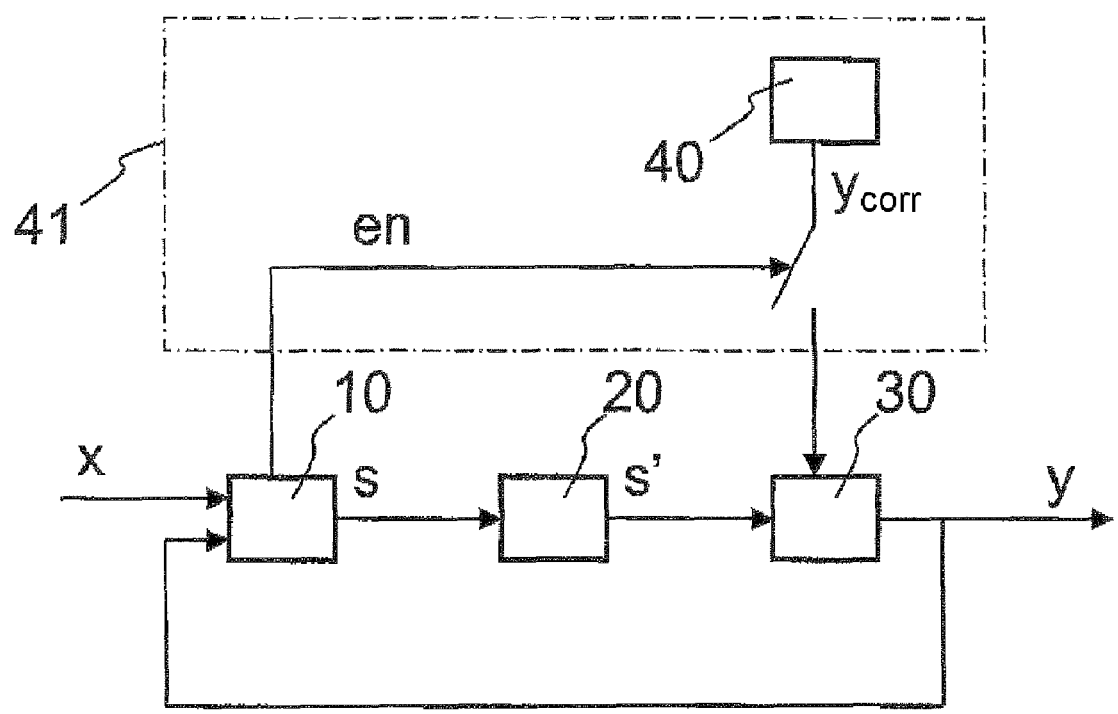
FIG. 2 illustrates a phase locked loop according to one embodiment of the invention having a phase detector unit, a loop filter unit, an oscillator unit and a phase correction unit.

FIG. 2 illustrates a phase locked loop according to one embodiment of the invention having a phase correction unit 41. The phase locked loop also includes a phase detector unit 10 having a first input and a second input. The reference signal x is supplied to the first input of the phase detector unit 10 and the clock signal y, which simultaneously represents the output signal from the phase locked loop, is supplied to the second input of the phase detector unit 10. The phase detector unit 10 is designed to determine the phase difference between the reference signal x and the clock signal y and to provide a phase difference signal s, which is dependent on this phase difference, at a first output of the phase detector unit 10. The phase detector unit 10 is also designed to signal the end $t_2$ of the pause 51 in the reference signal x using an output signal en at a second output of the phase detector unit 10.

The phase locked loop also includes a loop filter unit 20 having an input and an output. The phase difference signal s is supplied to the input of the loop filter unit 20. The loop filter unit typically has the characteristic of a PI filter or a P filter and is designed to provide a filtered phase difference signal s' at its output.

This filtered phase difference signal s' is supplied to a first input of an oscillator unit 30. The oscillator unit 30 is designed to change the frequency of the clock signal y, which is provided at a first output of the oscillator unit, in accordance with this phase difference signal. If the end $t_2$ of the pause 51 in the reference signal x is signaled at the second output of the phase detector 10 using the output signal en, a phase correction value $y_{corr}$, which is stored in a memory 40 and is used to correct the phase of the clock signal y in a clock period by that phase correction value $y_{corr}$, is additionally supplied to a second input of the oscillator. The phase correction unit 41 detects and signals the end $t_2$ of the pause 51.

Figure 3:
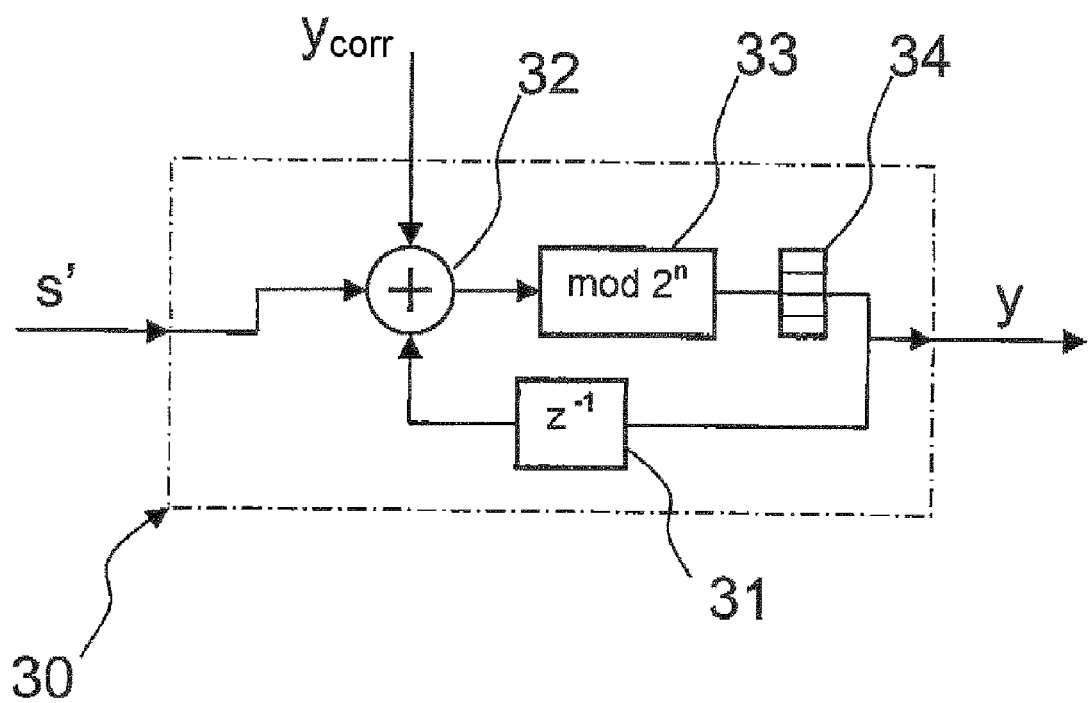
FIG. 3 illustrates an implementation example of the oscillator unit from FIG. 2.

FIG. 3 illustrates one possible implementation of the oscillator unit 30. The latter includes a state memory 31, an adder 32, a modulo $2^n$ operator 33 and an accumulator register 34. The filtered phase difference signal s', the value stored in the state memory 31 and, depending on the signal en, the phase correction value $y_{corr}$ as well are supplied to the adder. The output of the adder is connected to the input of the modulo $2^n$ operator 33 whose output is in turn connected to the accumulator register 34. The respective current value of the reconstructed transmission clock signal y is stored in this accumulator register 34. The value is additionally stored in the state memory 31 which is feedback-connected to the adder so that the value of the reconstructed transmission clock signal y is again available as the summand for the next addition.

The adder adds the value of the filtered phase difference signal s' and, depending on whether the phase detector unit signals an end of a pause in the reference signal x, also a phase correction value $y_{corr}$ to the value of the clock signal y stored in the state memory 31.

In practice, the modulo $2^n$ operator 33 is automatically implemented using the overflow of the accumulator register having a word length of n bits, the accumulator register constituting the result register of the adder. If the addition results in a value of greater than $2^n$, where n is the word length of the accumulator register, the register overflows, that is to say the mod $2^n$ operation is also applied to the result of the addition. Overflowing of the accumulator register corresponds to the end of an individual clock period $T_Z$.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for synchronizing a clock signal with a reference signal that comprises a first synchronization part having a bit pattern with a particular clock period, a pause whose length is a multiple of the clock period plus a fraction of the clock period, and a second synchronization part having the particular clock period, the method comprising:

generating a phase difference signal which is proportional to a phase difference between the clock signal and the reference signal;

filtering the phase difference signal and providing a filtered phase difference signal;

driving a digital oscillator such that the frequency of the clock signal is changed on the basis of the filtered phase difference signal; and wherein at an end of the pause in the reference signal the phase of the clock signal is corrected within one clock period by a value corresponding to the fraction of the clock period.

2. The method of claim 1, wherein the phase difference signal is set to zero at the beginning of the pause in the reference signal.

3. The method of claim 1, wherein the oscillator has an accumulator register, at least one state memory and an adder.

4. The method of claim 3, wherein the value which corresponds to the fraction of the clock period is added to a value stored in the accumulator register within one clock period.

5. A phase locked loop for synchronizing a clock signal with a reference signal, the phase locked loop comprising:

a phase detector unit for providing, as an output signal, a phase difference signal which is proportional to the phase difference between two input signals;

a filter unit for filtering the phase difference signal and for providing a filtered phase difference signal;

a register for storing a correction value; and an oscillator unit having an accumulator register for providing a clock signal whose frequency depends on the filtered phase difference signal and for adding the stored correction value to a value stored in the accumulator register, wherein the clock signal is corrected within one clock period of the ending of a pause in the reference signal by a value corresponding to a fraction of the clock period.

6. The phase locked loop of claim 5, wherein the phase detector unit is suitable for detecting and signaling the end of a pause in the reference signal.

7. The phase locked loop of claim 5, comprising wherein an output of the phase detector unit is connected to an input of the filter unit and an output of the filter unit is connected to an input of the oscillator unit, and wherein the output of the oscillator unit is fed back to another input of the phase detector unit.

8. The phase locked loop of claim 6, wherein the phase difference signal is set to zero at the beginning of the pause in the reference signal.

9. A phase locked loop circuit comprising:

means for receiving a clock signal and a reference signal and for providing a phase difference signal indicative of the phase difference between the clock and reference signals;

means for providing a filtered phase difference signal based on the phase difference signal;

means for storing a correction value corresponding to a fraction of the clock period;

means for providing the clock signal, the frequency of which depends on the filtered phase difference signal;

means for adding the stored correction valve to an accumulated value; and wherein at the end of a pause in the reference signal the phase of the clock signal is corrected within one clock period by the value corresponding to the fraction of the clock period.

10. The circuit of claim 9, wherein the frequency of the clock signal is changed based on the filtered phase difference signal.

11. The circuit of claim 9, wherein the means for providing the clock signal is an oscillator unit having an accumulator register.

12. The circuit of claim 11, further comprising means for detecting and signaling the end of the pause in the reference signal.

13. The circuit of claim 12, wherein the reference signal includes a first synchronization part having a bit pattern with a clock period, the pause with a length that is multiple of the clock period plus the fraction of the clock period, and a second synchronization part having the clock period.

14. The circuit of claim 13, wherein the phase difference signal is set to zero at the beginning of the pause in the reference signal.

15. The circuit of claim 13, wherein the oscillator has an accumulator register, at least one memory state and an adder.

16. The circuit of claim 15, wherein the value that corresponds to the fraction of the clock period is added to the value stored in accumulator register within one clock period.

* * * * *